US010177761B2

(12) United States Patent
Shionoya et al.

(10) Patent No.: US 10,177,761 B2
(45) Date of Patent: Jan. 8, 2019

(54) DIGITAL OUTPUT CIRCUIT, PRINTED-WIRING BOARD, AND INDUSTRIAL APPARATUS

(71) Applicant: Mitsubishi Electric Corporation, Tokyo (JP)

(72) Inventors: Hiroki Shionoya, Tokyo (JP); Satoru Ishizaka, Tokyo (JP); Hisashi Hirokawa, Tokyo (JP); Seigo Inobe, Hyogo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 57 days.

(21) Appl. No.: 15/534,039

(22) PCT Filed: Jan. 30, 2015

(86) PCT No.: PCT/JP2015/052751
§ 371 (c)(1),
(2) Date: Jun. 8, 2017

(87) PCT Pub. No.: WO2016/121114
PCT Pub. Date: Aug. 4, 2016

(65) Prior Publication Data
US 2018/0337673 A1 Nov. 22, 2018

(51) Int. Cl.
*H03K 17/78* (2006.01)
*H05K 1/18* (2006.01)

(52) U.S. Cl.
CPC .............. *H03K 17/78* (2013.01); *H05K 1/18* (2013.01); *H03K 2217/0081* (2013.01); *H03K 2217/941* (2013.01); *H05K 2201/10166* (2013.01)

(58) Field of Classification Search
CPC ..... H03K 2217/0081; H03K 2217/941; H03K 17/78; H05K 1/18; H05K 2201/10166
(Continued)

(56) References Cited

U.S. PATENT DOCUMENTS

2013/0148389 A1* 6/2013 Tanaka ................. H02M 5/458
                   363/37

FOREIGN PATENT DOCUMENTS

JP  62-196429 U  12/1987
JP  2000-164920 A  6/2000
(Continued)

OTHER PUBLICATIONS

JPO Office Action for Application No. 2016-553674 dated Dec. 20, 2016.
(Continued)

*Primary Examiner* — Thomas Skibinski
(74) *Attorney, Agent, or Firm* — Sughrue Mion, PLLC; Richard C. Turner

(57) ABSTRACT

A digital output circuit to be driven by an insulated power-supply circuit includes a transistor to turn on/off an external power supply in accordance with a signal output by a light receiving element in an insulating circuit in response to a signal processed by a controller. The external supply is connected to an output device. The output circuit includes a switching unit having first and second mechanisms to switch each of wires between a connected state and a non-connected state at two places between the light receiving element and the source or emitter of the transistor, and a logic adjusting unit to adjust inversion of a logic output of the light receiving element in correspondence to the type of the transistor, such that the output circuit is switched between a sink-current type and a source-current type.

9 Claims, 11 Drawing Sheets

(58) Field of Classification Search
USPC .............. 327/108–112, 427, 434, 437, 514; 363/37; 326/82, 83, 87
See application file for complete search history.

(56) References Cited

FOREIGN PATENT DOCUMENTS

| | | |
|---|---|---|
| JP | 2000-236143 A | 8/2000 |
| JP | 2009-055656 A | 3/2009 |
| JP | 2012-008763 A | 1/2012 |
| JP | 2012-075032 A | 4/2012 |
| JP | 2012-205001 A | 10/2012 |
| WO | 2012/025996 A1 | 3/2012 |

OTHER PUBLICATIONS

International Search Report for PCT/JP2015/052751 dated Apr. 7, 2015 [PCT/ISA/210].

* cited by examiner

DIGITAL OUTPUT CIRCUIT, PRINTED-WIRING BOARD, AND INDUSTRIAL APPARATUS

CROSS REFERENCE TO RELATED APPLICATIONS

This application is a National Stage of International Application No. PCT/JP2015/052751, filed on Jan. 30, 2015, the contents of all of which are incorporated herein by reference in their entirety.

FIELD

The present invention relates to a digital output circuit having an output transistor mounted thereon to perform control to power on/off a load.

BACKGROUND

Among industrial apparatuses including programmable controllers, there are a type of the industrial apparatus that uses a sink current to control an input device and an output device and a type of the industrial apparatus that uses a source current to control an input device and an output device so as to address various applications of the apparatuses for users. Where a field effect transistor is used as an output transistor, an N-type output transistor is used for the sink-current type, and a P-type output transistor is used for the source-current type. Where a bipolar transistor is used as an output transistor, an npn-type output transistor is used for the sink-current type, and a pnp-type output transistor is used for the source-current type.

Hereinafter, in the present description, an N-type field effect transistor and an npn-type bipolar transistor, which are used in circuit configurations of the sink-current type, are collectively called an N-type output transistor. Likewise, a P-type field effect transistor and a pnp-type bipolar transistor, which are used in circuit configurations of the source-current type, are collectively called a P-type output transistor.

In order to address the various applications for users, manufacturers of electronic components need to line up both the sink-current type of products and the source-current type of products, and thus the number of kinds of printed-wiring boards of these products increases.

Patent Literature 1 and Patent Literature 2 below disclose a technique which uses the small number of components to achieve the sink-current type of output circuit and the source-current type of output circuit on the same board. This technique also switches from a state where the components are mounted on the board to a state where the components are not mounted on the board or vice versa, or switches the wire connections between the components, to reduce the number of kinds of the boards.

For the technique of Patent Literature 1, the programmable controller switches the connection route between an external power supply and the base electrode of an output transistor, such that the circuit configuration of an output circuit is switched between the sink-current type and the source-current type on the same board.

In Patent Literature 2, the connection route on the printed wiring is switched and the position in which to mount an insulating circuit package is switched, such that the circuit configuration of an output circuit is switched between the sink-current type of circuit configuration and the source-current type of circuit configuration on the same board.

CITATION LIST

Patent Literature

Patent Literature 1: Japanese Patent Application Laid-open Publication No. 2000-236143

Patent Literature 2: Japanese Patent Application Laid-open Publication No. 2000-164920

SUMMARY

Technical Problem

However, in Patent Literature 1, four places between which the wire connections are switched depending on whether the circuit configuration is of the sink-current type or the source-current type are provided so as to invert the logic output of a light receiving element that outputs a gate signal to an output transistor. Although the output circuit is switchable between the sink-current type of output circuit and the source-current type of output circuit on the same board, the effect of reducing the man-hour and the manufacturing cost for printed-wiring boards on which to mount the output circuits are not enough because the number of places to switch the wire connections therebetween increases depending on the type of circuit configuration.

The present invention is achieved in view of the above, and an object of the invention is to provide a digital output circuit that uses the smaller number of places to switch a wire connection therebetween than that of the conventional art, such that the circuit configuration of an output circuit is switchable between the sink-current type and the source-current type on the same printed-wiring board incorporated in an industrial apparatus.

Solution to Problem

In order to solve the above problem, the present invention provides a digital output circuit to be driven a power-supply voltage generated by an insulated power-supply circuit, the digital output circuit including a light receiving element in an insulating circuit, the light receiving element responding to a signal processed by a controller, and an output transistor to perform an ON/OFF control on an external power supply in accordance with a gate signal output by the light receiving element, the external power supply being connected to an output device that is a load, the digital output circuit comprising: a wiring switching function unit to switch wires between the light receiving element and a source or an emitter of the output transistor; and a logic adjusting function unit to adjust inversion of a logic output of the light receiving element in correspondence to a type of the output transistor, such that the digital output circuit is switched between a sink-current type of circuit configuration and a source-current type of circuit configuration.

Advantageous Effects of Invention

The present invention achieves the effect of providing the digital output circuit wherein the mechanism to invert the logic output of the light receiving element is separately provided such that the smaller number of places to switch the wire connection therebetween than that of the conventional art is used to allow the circuit configuration of the output circuit to be switched between the sink-current type and the source-current type on the same printed-wiring board incorporated in the industrial apparatus.

DESCRIPTION OF EMBODIMENT

A digital output circuit according to an embodiment of the present invention will be described in detail below with reference to the drawings. Although in this embodiment the industrial apparatus is a programmable controller, an embodiment in which the present invention can be implemented are not limited to this.

First Embodiment

Figure 1:
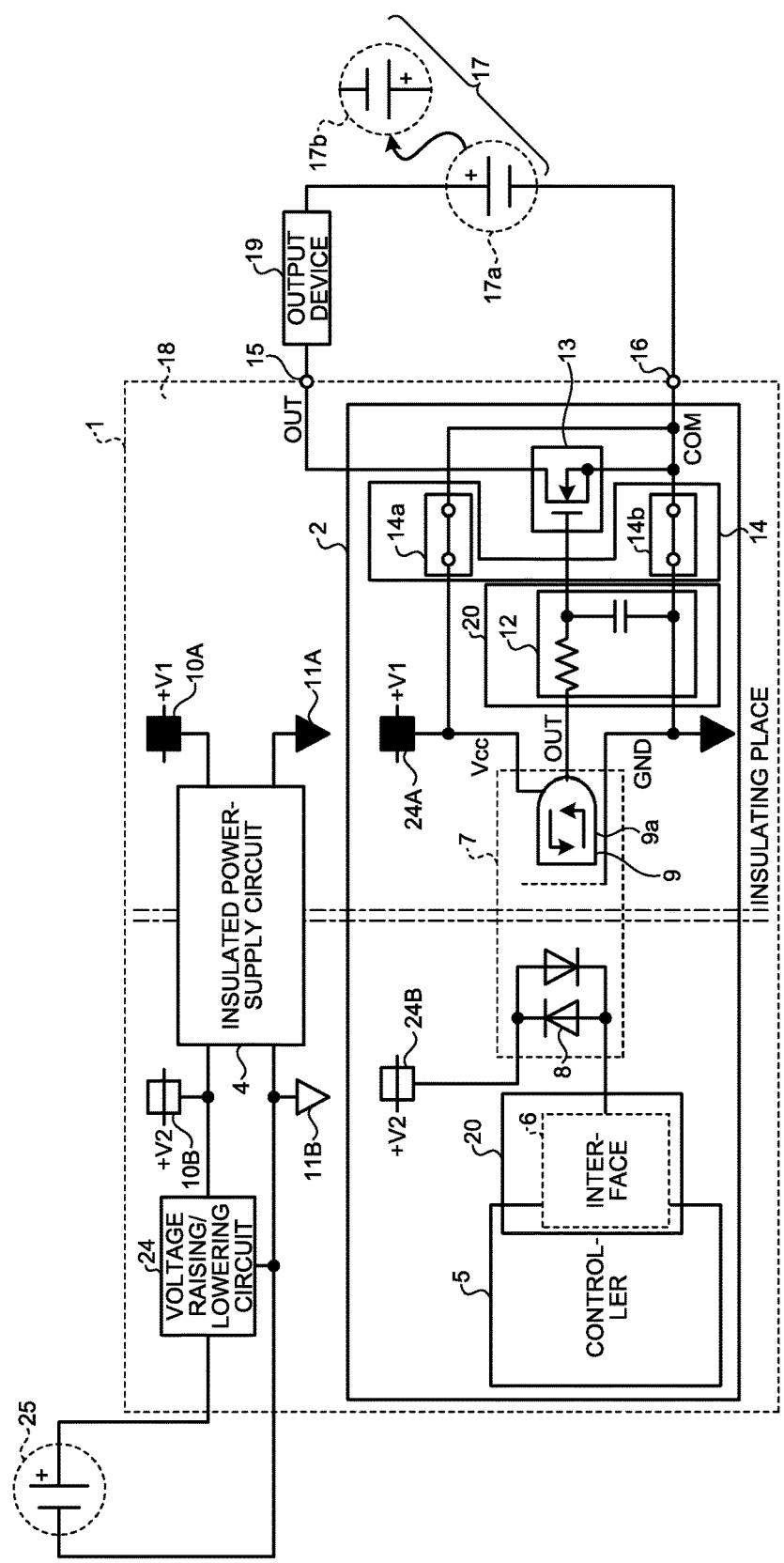
FIG. 1 is a circuit diagram illustrating an industrial apparatus according to an embodiment of the present invention and an output device and an external power supply connected to the industrial apparatus.
Figure 2:
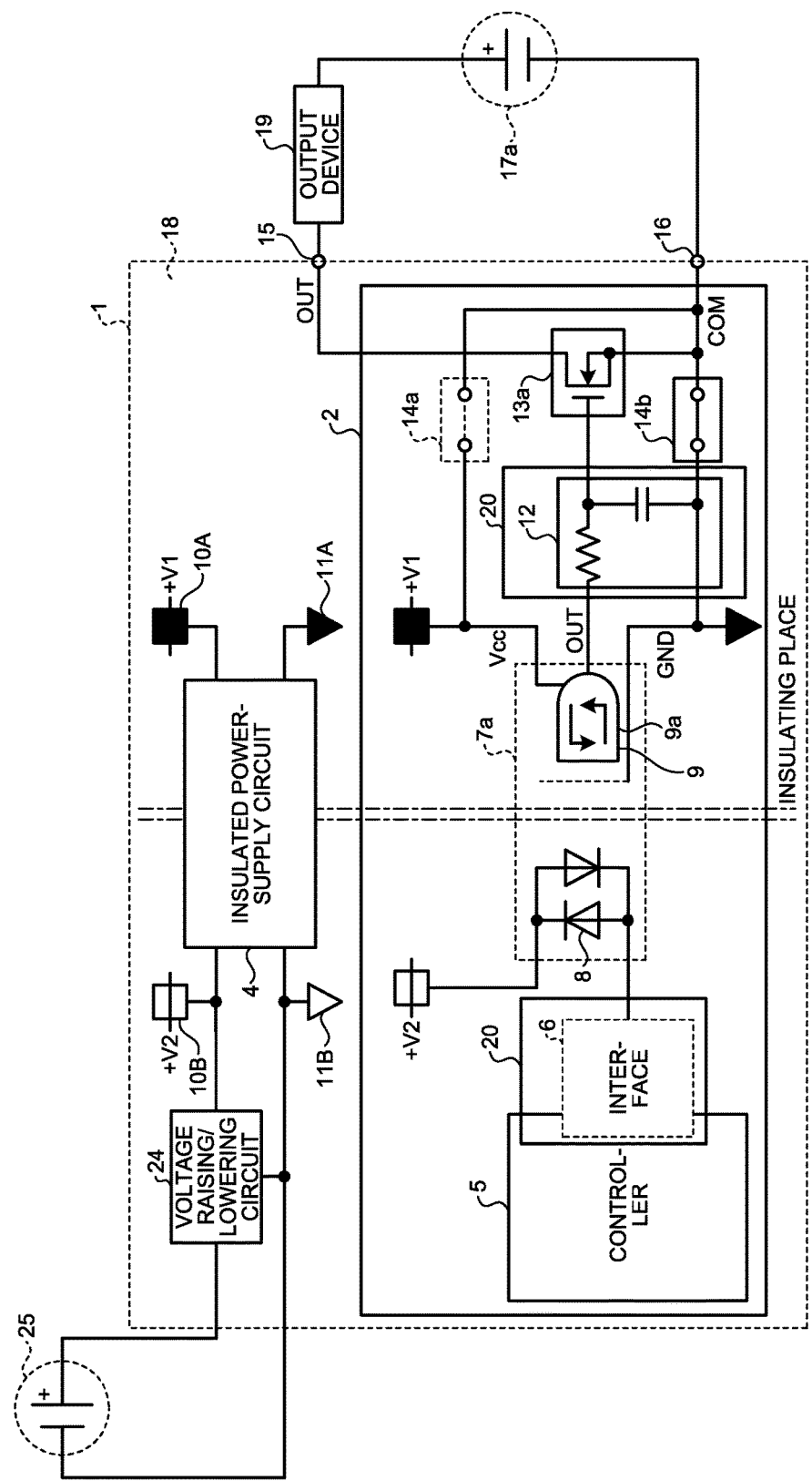
FIG. 2 is an example of a sink-current type of output circuit configuration using a high-speed-type insulating circuit.
Figure 3:
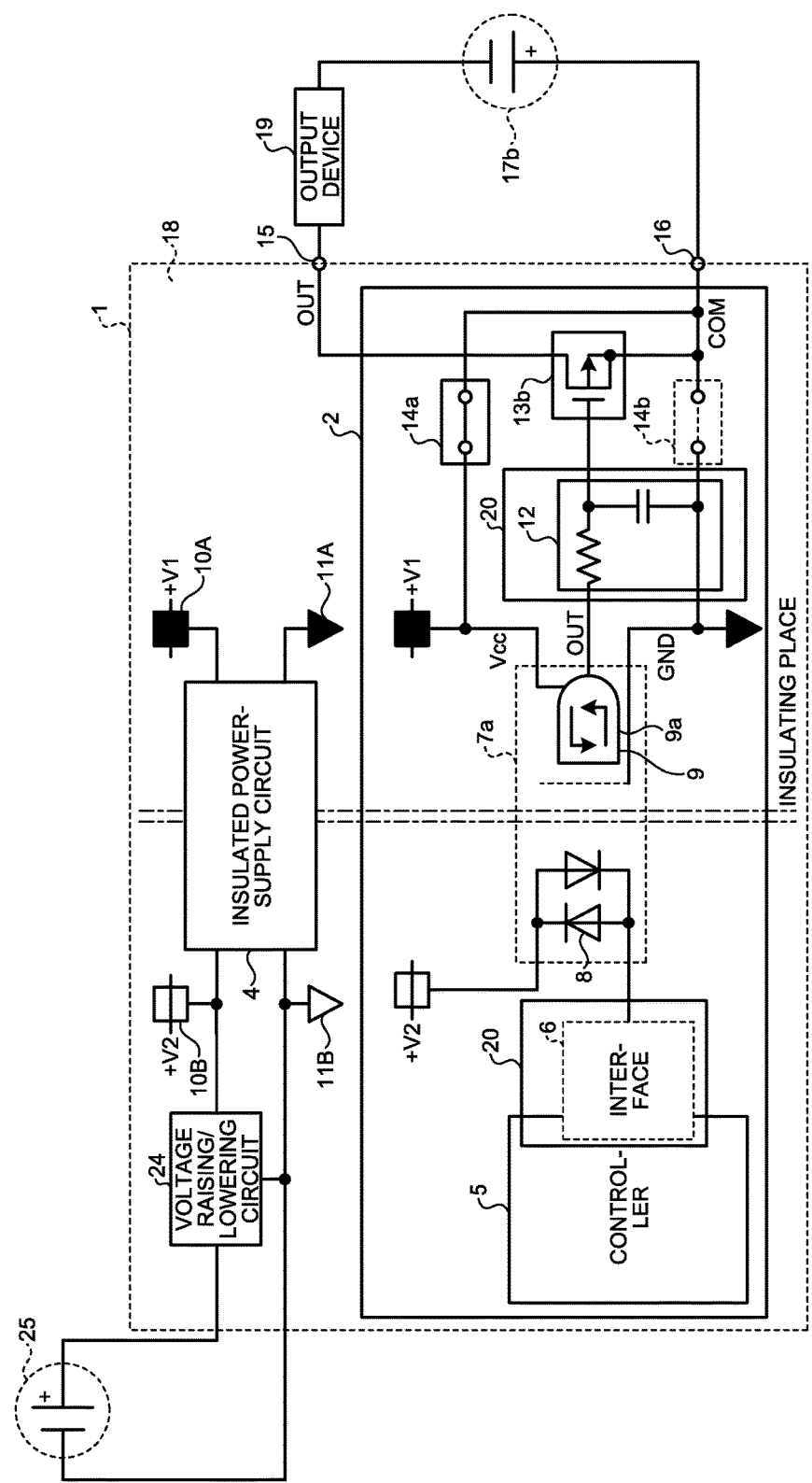
FIG. 3 is an example of a source-current type of output circuit configuration using the high-speed-type insulating circuit.

FIG. 1 is a circuit diagram illustrating an industrial apparatus according to a first embodiment and an output device and an external power supply connected to the industrial apparatus. FIGS. 2 and 3 are circuit diagrams illustrating two types of circuit configurations that can be employed in the output circuit illustrated in FIG. 1. The circuit configuration of FIG. 2 corresponds to the sink-current type, and the circuit configuration of FIG. 3 corresponds to the source-current type.

Referring to FIG. 1, the industrial apparatus 1 comprises a controller 5 that functions as a computing unit of the industrial apparatus 1, an insulating circuit 7 that incorporates a light receiving element 9 that outputs a gate signal described later, and an output transistor 13 that performs an ON/OFF control on an external power supply 17. Further, the industrial apparatus 1 comprises a printed-wiring board 18, and an output terminal 15 and a common terminal 16 that are connected to an output circuit 2. On the printed-wiring board, circuit elements including the insulating circuit 7 and the output transistor 13, and wires are mounted. The controller 5, which functions as a computing unit of the industrial apparatus 1, is driven by an internal power supply (not illustrated). The insulating circuit 7 is configured to have the light receiving element 9 and a light emitting element 8. The light receiving element 9 outputs a gate signal to the output transistor 13 in response to a signal processed by the controller 5. The output transistor 13 performs the ON/OFF control on a power supply to the output device 19 in accordance with the gate signal. The printed-wiring board 18 is a circuit board on which the controller 5, the insulating circuit 7, the output transistor 13, terminals 24A, 24B for connection to power supplies, and wires that electrically connect these constituents to one another are mounted.

The output circuit 2 realized according to the present embodiment further comprises a wiring switching function unit 14 that switches a wiring between the light receiving element 9 and the source electrode or emitter electrode of the output transistor 13 on the printed-wiring board 18 incorporated in the industrial apparatus 1. In FIG. 1, the wiring switching function unit 14 is constituted by two wiring switching mechanisms to embody the wiring switching function: a first connection switching mechanism 14a and a second connection switching mechanism 14b. An example of the first and second connection switching mechanisms (14a, 14b) is a jumper switch. The output circuit 2 realized according to the present embodiment further comprises an interface 6 to realize a logical determination adjusting function, described later, on the printed-wiring board 18. The interface 6 is an interface circuit interposed between the controller 5 and the insulating circuit 7 and can be implemented as a circuit or mechanism that can adjust a logical inversion in accordance with the type of the output transistor 13.

In FIG. 1, the main function unit that is a basic part constituting the first embodiment of the present embodiment is constituted by the output circuit 2, an insulated power-supply circuit 4, the output device 19, and the external power supply 17. The output circuit 2 is constituted by the controller 5 that is the computing unit of the industrial apparatus 1, the interface 6, an adjusting circuit 12 that functions as a filter circuit or drive circuit, the insulating circuit 7, and the output transistor 13. The insulated power-supply circuit 4 generates and applies an internal insulated power-supply voltage to the insulating circuit 7. The output device 19 is connected to the industrial apparatus 1. The external power supply 17 is a power supply for driving the output device 19. The interface 6 and the adjusting circuit 12 form a logic adjusting function unit 20. Further, the adjusting circuit 12 illustrated in FIG. 1 is a filter circuit.

The insulated power-supply circuit 4 comprises a power-supply output end 10A and an insulated GND end 11A to apply a power-supply voltage to the insulating circuit 7 and the output transistor 13 and is connected to a power-supply end 10B and a GND end 11B to apply a power-supply voltage to the light emitting element 8. The power-supply output end 10A and insulated GND end 11A are insulated from the power-supply end 10B and GND end 11B. Although in FIG. 1 a voltage of +V1 is connected from the power-supply output end 10A, and a voltage of +V2 is connected from the power-supply end 10B, the voltage of +V1 may be equal to the voltage of +V2 (V1=V2). Further, if a dedicated power supply 25 is used as a power supply separate from the external power supply 17 in order to enable the internal circuit of the industrial apparatus 1 to operate, as illustrated in the figure, a power-supply voltage from the dedicated power supply 25 is raised/lowered by a voltage raising/lowering circuit 24, and the raised/lowered voltage is pulled with the current from the dedicated power supply 25 being insulated, such that the raised/lowered voltage can be supplied as an operating voltage to the insulated power-supply circuit 4. Since the insulated power-supply circuit 4 is provided with the power supply as discussed above, the insulated power-supply circuit 4 can function to apply the raised/lowered voltage as the operating voltage to the insulating circuit 7 via the power-supply output end 10A and power-supply end 10B.

As mentioned above, FIG. 2 illustrates an example of the circuit configuration of the industrial apparatus 1 corresponding to the sink-current type. In configuring the sink-current type of output circuit, a high-speed-type insulating circuit 7a, which is illustrated also in FIG. 1, is used as the insulating circuit 7. An output transistor 13a that is an N-type field effect transistor as illustrated also in FIG. 1 is used as the output transistor 13. An external power supply 17a to apply a low-potential-side voltage to the source electrode of the output transistor 13a is used as the external power supply 17. Further, in FIG. 2, the second connection switching mechanism 14b is connected to the source electrode of the output transistor 13a and the insulated GND end 11A of the light receiving element 9, and the first connection switching mechanism 14a is in a non-connected state. It is assumed that the second connection switching mechanism 14b has a resistance of 0Ω.

Figure 4:
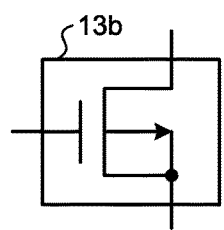
FIG. 4 illustrates a P-type field effect transistor mountable on the output circuit according to the first embodiment.

As mentioned above, FIG. 3 illustrates an example of the circuit configuration of the industrial apparatus 1 corresponding to the source-current type. As in FIG. 2, an insulating circuit 7a that is a high-speed-type insulating circuit is used while an output transistor 13b that is a P-type field effect transistor illustrated in FIG. 4 is used as the output transistor 13 and an external power supply 17b to apply a high-potential-side voltage to the source electrode of the output transistor 13b is used as the external power supply 17. Further, the first connection switching mechanism 14a is connected to the source of the output transistor 13b and the light receiving element 9 such that the power-supply voltage +V1 is applied to the first connection switching mechanism 14a as well as to the light receiving element 9, and the second connection switching mechanism 14b is in a non-connected state. It is assumed that the first connection switching mechanism 14a has a resistance of 0Ω.

The present embodiment discloses a configuration that enables the circuit configuration of the output circuit 2 to be switched between the sink-current type and the source-current type on the same board. The present embodiment realizes the foregoing configuration by selecting one of a mounted state where the components are mounted on the printed wiring and a non-mounted state where the components are not mounted on the printed wiring or by switching the wire connection on the printed wiring, in accordance with the type of the output transistor 13 to be mounted on the printed-wiring board 18.

The main points of the digital output circuit according to the present embodiment will be described below. In the present embodiment, the dedicated power supply 25 provided exclusively for operating the internal circuit of the industrial apparatus 1 is used separately from the external power supply 17 (17a, 17b), and a power-supply voltage from the dedicated power supply 25 is raised/lowered by the voltage raising/lowering circuit 24, and the current from the dedicated power supply 25 is insulated by the insulated power-supply circuit 4, such that the operating voltage is supplied to the insulating circuit 7. The present embodiment realizes the function of switching the circuit configuration of the output circuit 2 on the same printed-wiring board 18 between the sink-current type and the source-current type. This function is realized by the wiring switching function unit 14. More specifically, the wiring switching function unit 14 according to the present embodiment is the wiring switching function unit 14 that can switch the wire connection between the two places in correspondence to each of the N-type output transistor 13a and the P-type output transistor 13b. By including this wiring switching function unit 14, the output circuit 2 according to the present embodiment realizes the sink-current type of circuit configuration and the source-current type of circuit configuration on the same printed-wiring board 18.

In the present embodiment, on the same printed-wiring board 18 incorporated in the industrial apparatus 1, the interface 6 that is a mechanism to invert the logic output of the light receiving element 9 is provided in addition to the wiring switching function unit 14. Thus, in the present embodiment, the number of places to switch the wire connection therebetween can be reduced from four to two, as compared with Patent Literature 1. Further, in the present embodiment, the difference in response speed due to the difference in characteristics between the types of the output transistor 13 can be adjustable using the adjusting circuit 12 that is a filter circuit or drive circuit. In the present embodiment, the logical inversion according to the type of the output transistor 13 can be adjustable using the interface 6. Thus, in the present embodiment, the difference in performance between the output circuit 2 having the sink-current type of circuit configuration and the output circuit 2 having the source-current type of circuit configuration can be adjusted. As such, either the adjusting circuit 12 or the interface 6 can also be used to adjust the difference in response speed due to the difference in characteristics between the types of the output transistor 13 or adjust the logical inversion. Thus, the logic adjusting function unit 20 illustrated in FIGS. 1 to 3 refers collectively to both the adjusting circuit 12 and the interface 6 for adjusting the difference in response speed or the logical inversion.

The more detailed operation principle of the industrial apparatus 1 incorporating the printed-wiring board 18 will be described further specifically below. The description below is made as to the operation of the digital output circuit of the present embodiment where the N-type output transistor is mounted and the logical inversion function of the interface 6 described later is not used. One example of the operation of turning on the external power supply 17 connected to the output device 19 is as follows. When the voltage level of the output signal output from the controller 5 changes from a high level to a low level, a current flows through the light emitting element 8 in the insulating circuit 7, so that the light emitting element 8 produces light to thereby turn the light receiving element 9 on. Then, the potential difference occurring between the internal insulated power-supply voltage +V10A generated by the insulated power-supply circuit 4 and the insulated GND end 11A causes a potential difference between the gate and the source of the output transistor 13a or between the base and the emitter of the output transistor 13a, so that the output transistor 13a goes into an ON state to thereby carry a current from the external power supply 17 connected to the output device 19, to the output device 19.

In the same way as above, where the logical inversion function of the interface 6 described later is not used, one example of the operation of turning off the external power supply 17 connected to the output device 19 is as follows. When the voltage level of the output signal output from the controller 5 changes from the low level to the high level, a current stops flowing through the light emitting element 8 in the insulating circuit 7, so that the light emitting element 8 does not produce light, and thus the light receiving element 9 turns off. Then, a potential difference does not occur between the gate and source (the base and emitter) of the output transistor 13a, so that the output transistor 13a goes into an OFF state, and thus a current does not flow from the external power supply 17 connected to the output device 19, to the output device 19.

As mentioned above, in the present embodiment, the sink-current type of circuit configuration using the N-type output transistor generates a plus potential on the gate electrode or base electrode with respect to the source electrode or emitter electrode of the output transistor 13a, thereby carrying a current through the output device 19. In contrast, the source-current type of circuit configuration using the P-type output transistor 13b generates a minus potential on the gate electrode or base electrode with respect to the source electrode or emitter electrode of the output transistor 13b, thereby carrying a current through the output device 19.

If the controller 5 has a function of recognizing the type of output transistor and changing the logic of the output voltage level in accordance with the result of the recognition, the interface 6 can be omitted. On the other hand, if the controller 5 cannot recognize the type of output transistor and change the logic of the output voltage level, the logic of a signal applied between the source electrode or emitter electrode and the gate electrode or base electrode of the N-type or P-type output transistor 13 is inverted. Thus, if the controller 5 cannot recognize the above type, in the present embodiment, the logic adjustment can be performed by inverting the logic in the interface 6. Further, the interface 6 can be mounted as any mechanism which can adjust the logical inversion in accordance with the type of the output transistor 13. Alternatively, the function of adjusting the logic can be implemented by an adjusting circuit 12"b or another element which has the function incorporated in the controller 5, the function provided outside the controller 5, a replacement function of substituting an insulating circuit 7b whose logic is inverted, or a function of adjusting the post-insulation logic, but the function of adjusting the logic is not limited to these.

Although the N-type output transistor is replaced with the P-type output transistor in switching the output circuit from the sink-current type of output circuit to the source-current type of output circuit, the existing output transistor can be replaced with complementary output transistors in order to keep the performance of the output circuit 2 at the same level. Also, in the present embodiment, apart from being replaced with the complementary output transistors, the existing output transistor may be replaced with transistor elements having a pin-compatible relation such as an N-type output transistor and a P-type output transistor having their characteristics close to each other.

Figure 5:
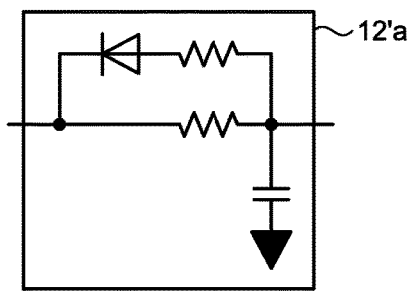
FIG. 5 illustrates a filter circuit mountable on the output circuit according to the first embodiment.
Figure 6:
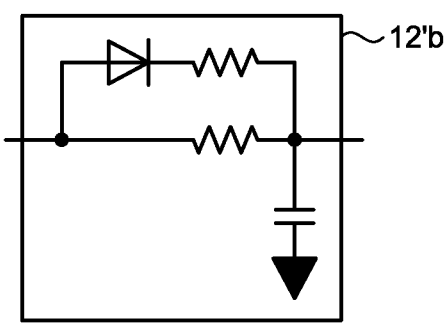
FIG. 6 illustrates a filter circuit mountable on the output circuit according to the first embodiment.
Figure 7:
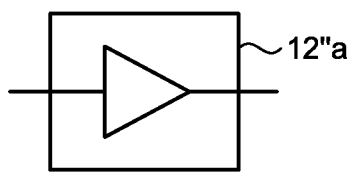
FIG. 7 illustrates a driver circuit mountable on the output circuit according to the first embodiment.
Figure 8:
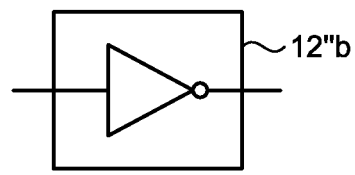
FIG. 8 illustrates a driver circuit mountable on the output circuit according to the first embodiment.

In the present embodiment, the difference in characteristic between the N-type output transistor 13a and the P-type output transistor 13b causes a difference in response speed in switching ON/OFF the external power supply 17 connected to the output device 19. Accordingly, in the present embodiment, the adjusting circuit 12 adjusts the response speed by changing the duration of the ON states or OFF states of the output transistors 13a, 13b. For example, when the response speed of the P-type output transistor is slower than that of the N-type output transistor, the response speed difference can be adjusted by changing element values for the P-type output transistor and the N-type output transistor, using a resistor and capacitor in the adjusting circuit 12. The function of adjusting the response speed difference can be implemented by any mechanism which can adjust the above response speed. The mechanism which can adjust the response speed difference can be realized by a filter circuit 12'a of FIG. 5 or 12'b of FIG. 6 that adjusts the duration of any of the gate signal output to the gate of the output transistor, the ON state or OFF state, or can be realized by a drive circuit 12"a of FIG. 7 or 12"b of FIG. 8 that adjusts the response speed. The mechanism which can adjust the response speed difference can be also realized by the controller 5 configured to control the gate signal width for the ON/OFF control. The mechanism which can adjust the response speed difference is not limited to these. Note that the mechanism or function which adjusts the response speed difference may be omitted when the specification of the industrial apparatus 1 or the specific configuration of the output circuit does not require the adjustment of the response speed difference.

Figure 9:
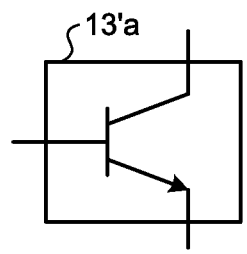
FIG. 9 illustrates an npn-type bipolar transistor mountable on the output circuit according to the first embodiment.
Figure 10:
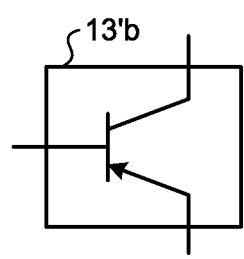
FIG. 10 illustrates a pnp-type bipolar transistor mountable on the output circuit according to the first embodiment.

Although, in the present embodiment, the field effect transistors are used as the N-type output transistor 13a and the P-type output transistor 13b, bipolar transistors such as an output transistor 13'a of FIG. 9 or an output transistor 13'b of FIG. 10 can be used.

Further, although it is assumed that the first and second connection switching mechanisms (14a, 14b) have a resistance of 0Ω, in the present embodiment, the wire connection can be switched selectively manually in conformity with the type of the output circuit 2. Yet further, the present embodiment may employ a mechanism in which the controller 5 recognizes the type of the circuit configuration of the output circuit 2 and, in accordance with the result of the recognition, selectively switches the wire connection to conform to the type of the circuit configuration of the output circuit 2 by using an analog switch, analog channel, or the like.

A protection circuit that is a diode and a filter circuit are inserted to the output terminal 15 and the common terminal 16. Also, a pull-up resistor, a pull-down resistor, or an anti-noise filer to stabilize the logic can be provided between the output transistor 13 and the insulating circuit 7 or between the insulating circuit 7 and the controller 5.

Figure 11:
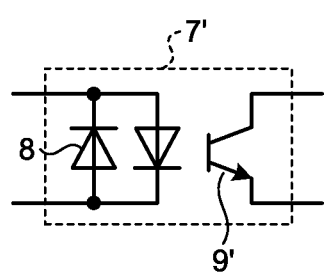
FIG. 11 illustrates an insulating circuit including a phototransistor mountable on the output circuit according to the first embodiment.
Figure 12:
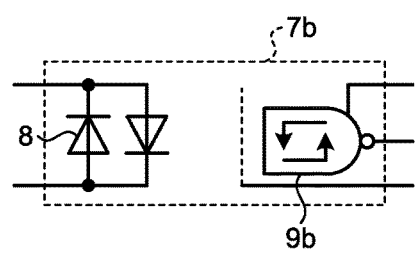
FIG. 12 illustrates an insulating circuit including a photo-IC mountable on the output circuit according to the first embodiment.
Figure 13:
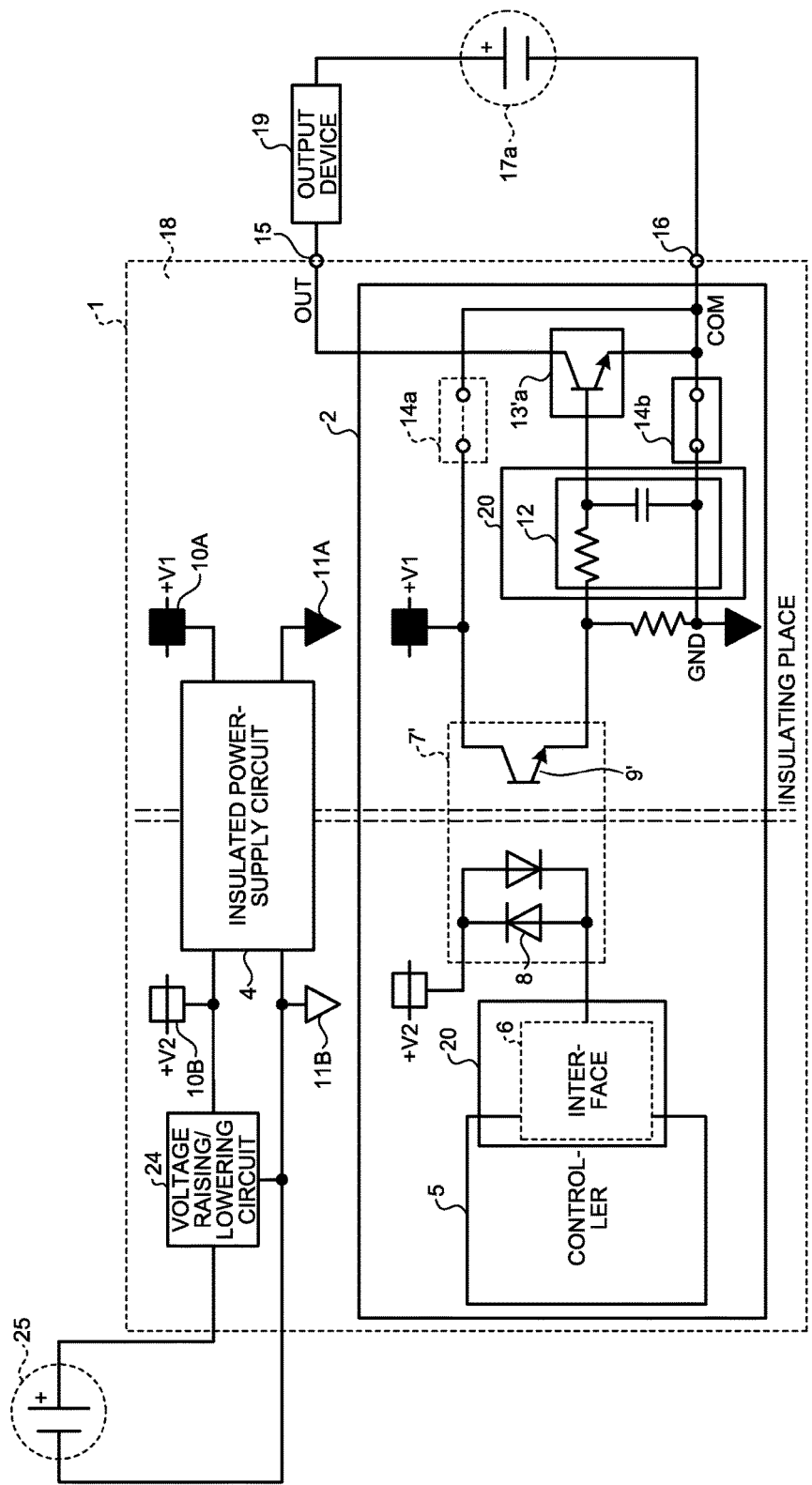
FIG. 13 is a practical example of the sink-current type of output circuit configuration using an insulating circuit having a phototransistor.
Figure 14:
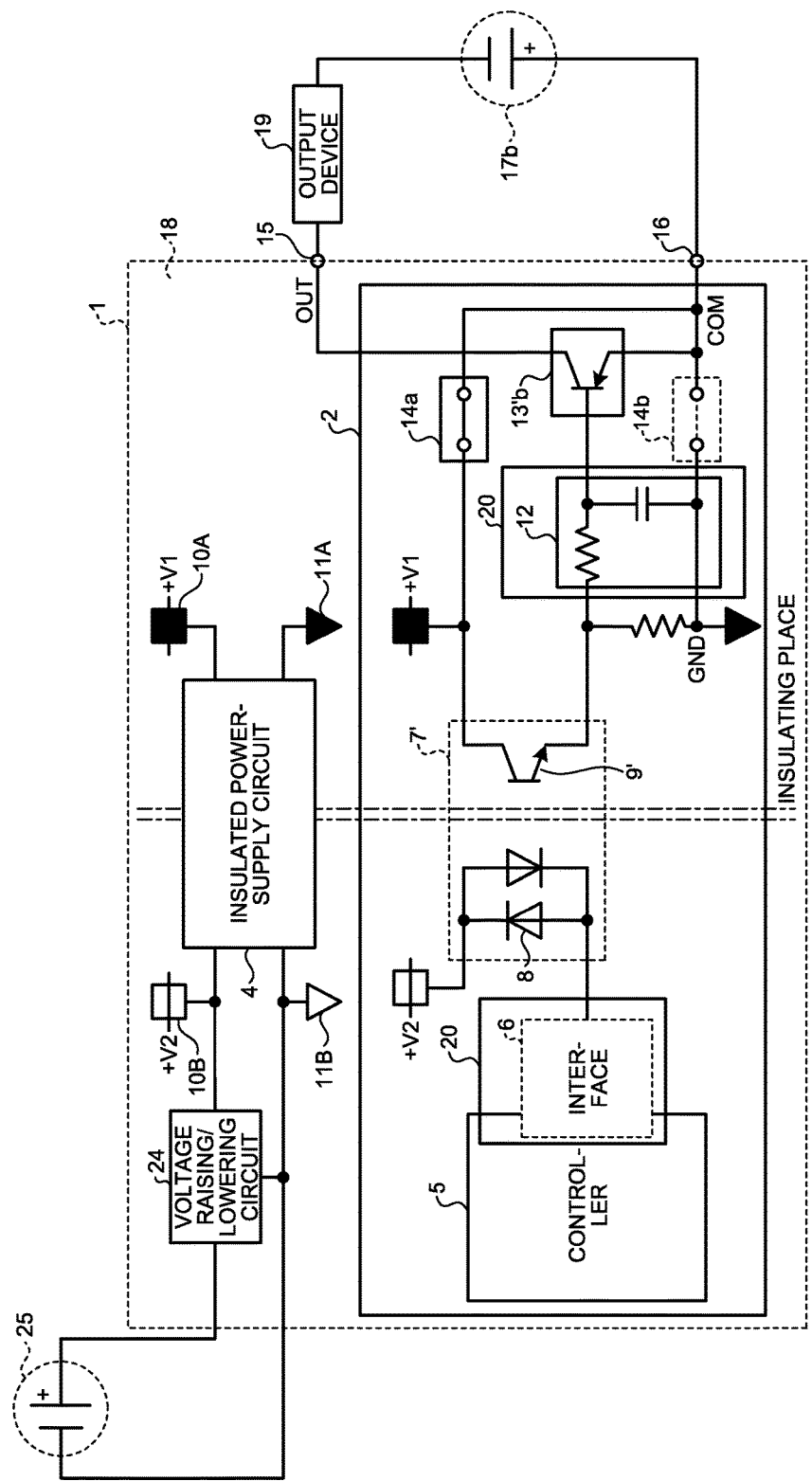
FIG. 14 is a practical example of the source-current type of output circuit configuration using an insulating circuit having a phototransistor.

FIG. 13 illustrates one example of an output circuit having the sink-current type of circuit configuration where the light receiving element 9 of the insulating circuit 7 is a phototransistor 9' of FIG. 11 or a photo-IC 9a or 9b of FIG. 1 or 12. FIG. 14 illustrates one example of an output circuit having the source-current type of circuit configuration where the light receiving element 9 of the insulating circuit 7 is a phototransistor 9'.

In FIG. 13, the output transistor 13'a is used as an N-type output transistor, and the second connection switching mechanism 14b is connected to the emitter of the output transistor 13'a and the insulated GND end 11 while the first connection switching mechanism 14a is in a non-connected state. In FIG. 14, the output transistor 13'b is used as a P-type output transistor, and the first connection switching mechanism 14a is connected to the emitter of the output transistor 13*b* and the internal insulated power supply +V10A while the second connection switching mechanism 14*b* is in a non-connected state.

The light emitting element 8 of the insulating circuit 7 is not limited to a bidirectional light emitting element, but the insulating circuit 7 may be made of any elements as long as such elements provide a circuit or elements which can achieve electrical insulation, and the light receiving element 9 is not limited to a phototransistor or photo-IC.

As such, the present embodiment achieves the effect of providing the digital output circuit wherein the logic adjusting function unit 20 that is the mechanism to invert the logic output of the light receiving element 9 is provided separately such that the smaller number of places to switch the wire connection therebetween is used to allow the circuit configuration of the output circuit 2 to be switched between the sink-current type and the source-current type on the same printed-wiring board 18 incorporated in the industrial apparatus 1.

In addition, the present embodiment can achieve a mechanism that accommodates the difference in element characteristic between the sink-current type and the source-current type in switching the circuit configuration of the output circuit 2, on the same printed-wiring board 18, between the sink-current type and the source-current type. Therefore, the present embodiment produces the effect of providing the output circuit 2 that can switch the circuit configuration between the sink-current type and the source-current type while maintaining the same performance as well as using the smaller number of components.

Figure 15:
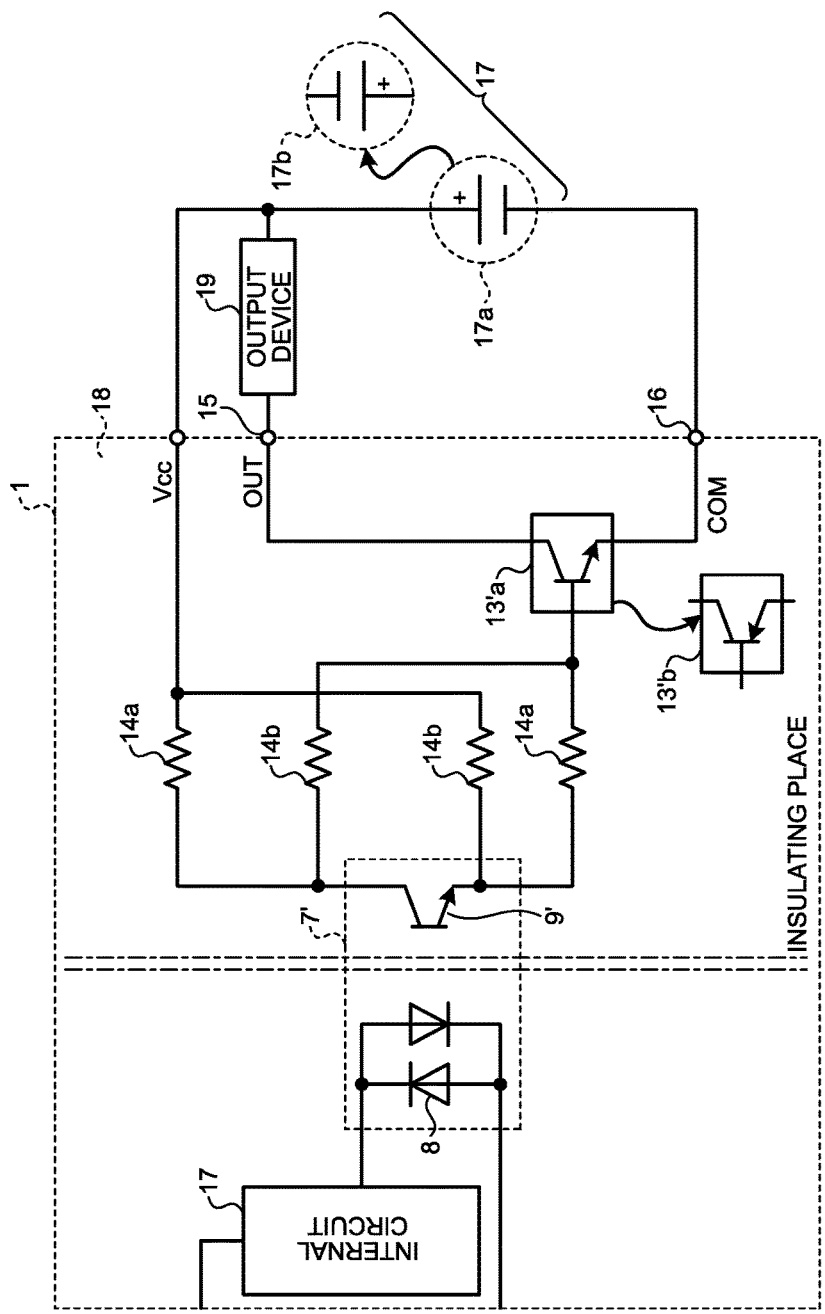
FIG. 15 illustrates the circuit configuration of a digital output circuit of the conventional art.

FIG. 15 illustrates the circuit configuration of Patent Literature 1 including a main function unit, and an output device and an external power supply connected to that main function unit for the purpose of comparison of the digital output circuit systems of the present embodiment with the conventional art. The output circuit system of Patent Literature 1 illustrated in FIG. 15 switches connection paths between the external power supply and the base electrode of the output transistor by a switching operation of the programmable controller. This enables the output circuit system of Patent Literature 1 to switch the circuit configuration of the output circuit on the same board between the sink-current type and the source-current type. The output circuit system of Patent Literature 2 switches the output circuit between the sink-current type of output circuit and the source-current type of output circuit on the same board by switching connection paths of the printed wiring of Patent Literature 1 and also switching the position in which to mount the insulating circuit package.

There are various voltage ranges of the external power supply for an output device to be connected to a general industrial apparatus while, in Patent Literatures 1 and 2, the power supply to be connected to the insulating circuit and the power supply for driving the output transistor are the same as the external power supply for an output device. In addition, when the output device that is a load is an inductive load or a capacitive load, the output circuit in the industrial apparatus is affected not a little by the load of the output device. Thus, the output circuit in the industrial apparatus may be falsely operated depending on the type of the load connected to the industrial apparatus.

Further, when a high-speed-type insulating circuit is used in the output circuit, another power supply is needed for the high-speed-type insulating circuit, but the power supply for driving the insulating circuit and the external power supply for the output device may differ from each other in the appropriate range of voltages to be outputted. Thus, when the same power supply as the external power supply for the output device supplies power to the power supply for driving the insulating circuit and the power supply for driving the output transistor, there are the following limitations regarding the selection of elements or a power supply. First, the output device to be connected to the industrial apparatus must select a power supply which can output a suitable range of voltages, depending on the appropriate range of voltages that should be output by the driving power supply used for the high-speed-type insulating circuit. Further, in using the high-speed-type insulating circuit, the high-speed-type insulating circuit needs to be selected which can be normally driven in the range of voltages which the external power supply for the output device can output.

Yet further, when the same power supply as the external power supply for output devices supplies power to the power supply for driving the insulating circuit and the power supply for driving the output transistor, a wiring from the external power supply to a terminal connected to the insulating circuit needs to be laid for each of channels to supply power to a plurality of the output devices respectively. As a result, in the techniques of Patent Literatures 1 and 2, the wiring man-hour for connection to the output devices increases. Further, where a single wire leads from the external power supply to a terminal connected to the insulating circuit, current of all the channels flows through the single wire for driving the insulating circuit. Accordingly, the total number of channels to supply the power to a plurality of output devices needs to be limited to a channel number that provides the range of current acceptable to the single wire, or the drive capacity of the insulating circuit needs to be decreased. This results in a problem of a limited response speed of the output circuit.

However, where the dedicated power supply 25 different from the external power supply 17 is used to operate the internal circuit of the industrial apparatus 1, it is known that a power-supply voltage from the dedicated power supply 25 is raised/lowered by the voltage raising/lowering circuit 24 and the insulated power-supply circuit 4 can be used for the purpose of pulling the raised/lowered voltage with the current from the dedicated power supply 25 being insulated. For that purpose, the insulated power-supply circuit 4 can function to output the raised/lowered voltage as an operating voltage to the insulating circuit 7 via the internal insulated power supply +V10A and the insulated GND end 11A.

Since the insulated power-supply circuit 4 functions in the manner as discussed above, the present embodiment can avoid the possibility that the output circuit 2 in the industrial apparatus 1 may be falsely operated because of variation in impedance due to the inductive load or capacitive load of the output device 19. Further, even if the range of voltages which the external power supply 17 can output is different from the range of voltages that can drive the insulating circuit 7, the above insulation and the raising/lowering of the voltage makes it possible to supply a power-supply voltage in an appropriate voltage range to the insulating circuit 7. Yet further, since the above power supply insulation is performed in the insulated power-supply circuit 4, it is unlikely that the current of all the channels flows through the single wire for driving the insulating circuit 7. Thus, the wiring man-hour necessary to connect the output device 19 to the industrial apparatus 1 can be reduced without being subject to any limitation on the number or type of output devices to be connected.

As such, the present embodiment uses the internal insulated power supply to thereby achieve the digital output circuit that reduces the wiring man-hour necessary for the wiring connection without limiting the type of the load of the output device and the insulating-circuit driving-capacity, and realizes the high response speed of the output circuit 2 without being subject to any limitation on the number or type of output devices to be connected.

REFERENCE SIGNS LIST 1 industrial apparatus, 2 output circuit, 4 insulated power-supply circuit, 5 controller, 6 interface, 7a high-speed-type insulating circuit, 7b high-speed-type insulating circuit, 7' general-purpose insulating circuit, 8 light emitting element, 9 light receiving element, 9a photo-IC, 9b photo-IC (logically inverted from 9a), 9' phototransistor, 10A, 10B power-supply output end, 11A, 11B insulated GND end, 12, 12'a, 12'b, 12"a, 12"b adjusting circuit, 13a output transistor, 13'a, 13b, 13'b output transistor, 14 wiring switching function unit, 14a first connection switching mechanism, 14b second connection switching mechanism, 15 output terminal, 16 common terminal, 17 external power supply, 18 printed-wiring board, 19 output device, 20 logic adjusting function unit, 24 voltage raising/lowering circuit, 25 dedicated power supply.

The invention claimed is:

1. A digital output circuit to be driven a power-supply voltage generated by an insulated power-supply circuit, the digital output circuit including an output transistor to perform an ON/OFF control on an external power supply in accordance with a gate signal output by a light receiving element in an insulating circuit in response to a signal processed by a controller, the external power supply being connected to an output device that is a load, the digital output circuit comprising:
 a wiring switching function unit having first and second connection switching mechanisms to switch each of wires between a connected state and a non-connected state at two places between the light receiving element and a source or an emitter of the output transistor; and
 a logic adjusting function unit to adjust inversion of a logic output of the light receiving element in correspondence to a type of the output transistor,
 such that the digital output circuit is switched between a sink-current type of circuit configuration and a source-current type of circuit configuration.

2. The digital output circuit according to claim 1, wherein the logic adjusting function unit includes an interface interposed between the controller and the insulating circuit, and
 wherein the controller or the interface executes a function of adjusting the inversion of the logic output in correspondence to the type of the output transistor mounted on the digital output circuit.

3. The digital output circuit according to claim 1, wherein a voltage raising/lowering circuit raises/lowers a power-supply voltage from a dedicated power supply different from the external power supply, and the insulated power-supply circuit pulls an operating voltage that is the raised/lowered power-supply voltage, to thereby output the operating voltage to the insulating circuit, and
 wherein the insulated power-supply circuit allows a high-speed-type insulating circuit to be mounted, the high-speed-type insulating circuit requiring supply of a power in a voltage range different from that of the external power supply.

4. The digital output circuit according to claim 1, wherein the output transistor is replaced with complementary transistor elements or pin-compatible transistor elements to thereby switch a type of circuit configuration of the digital output circuit between the sink-current type of circuit configuration and the source-current type of circuit configuration.

5. The digital output circuit according to claim 1, wherein the logic adjusting function unit includes an adjusting circuit constituted by a filter circuit or a drive circuit, and
 wherein the adjusting circuit controls an ON/OFF switching duration of the gate signal in accordance with a type of the output transistor, to thereby adjust a response speed difference in an ON/OFF switching.

6. The digital output circuit according to claim 1, wherein when the controller, in place of the logic adjusting function unit, recognizes a type of the output transistor corresponding to the type of the circuit configuration, the controller controls an ON/OFF switching duration of the gate signal in accordance with the type, to thereby adjust a response speed difference in an ON/OFF switching by the type of the output transistor.

7. The digital output circuit according to claim 1, wherein when the controller recognizes the type of the output transistor corresponding to the type of the circuit configuration, an analog channel and an analog switch having received a signal from the controller switch a wire connection to thereby switch the type of circuit configuration between the sink-current type of circuit configuration and the source-current type of circuit configuration.

8. A printed-wiring board comprising the digital output circuit according to claim 1, wherein a type of circuit configuration is switchable between a sink-current type of circuit configuration and a source-current type of circuit configuration on a same printed-wiring board by selecting one of a state where components are mounted on the printed-wiring board and a state where the components are not mounted on the printed-wiring board or by switching a wire connection in printed wiring, in correspondence to the type of the output transistor to be mounted on the digital output circuit.

9. An industrial apparatus including a programmable controller incorporating the printed-wiring board according to claim 8.

* * * * *